United States Patent [19]

Aschwanden

[11] 4,352,206

[45] Sep. 28, 1982

[54] COMPARISON ARRANGEMENT FOR A DIGITAL TUNING SYSTEM

[75] Inventor: Felix Aschwanden, Thalwil, Switzerland

[73] Assignee: RCA Corporation, New York, N.Y.

[21] Appl. No.: 242,619

[22] Filed: Mar. 11, 1981

[30] Foreign Application Priority Data

Apr. 8, 1980 [GB] United Kingdom ................. 8011554

[51] Int. Cl.³ .............................................. H04B 1/26
[52] U.S. Cl. ..................................... 455/184; 455/186
[58] Field of Search ................. 455/164, 182, 184, 186

[56] References Cited

U.S. PATENT DOCUMENTS 4,053,933 10/1977 Collins .............................. 358/191.1
4,110,695 8/1978 Klank et al. ......................... 455/184
4,184,121 1/1980 Tanaka ................................ 455/182

*Primary Examiner*—Marc E. Bookbinder
*Attorney, Agent, or Firm*—E. M. Whitacre; P. J. Rasmussen; P. M. Emanuel

[57] ABSTRACT

In a tuning system including a station selector for generating a digital word representative of a selected channel, a counter for counting periods of a local oscillator signal during a measurement interval to generate a digital word representing the accumulated count and a comparator for generating control signals for the local oscillator in accordance with the deviation between the station-representative and count-representative digital words, apparatus is provided to enable the number of bits in the count-representative digital word to be less than the number of bits in the station-representative digital word. Such an arrangement is therefore particularly useful when it is desired to incorporate a large portion of the tuning system in a relatively inexpensive microcomputer in which only a relatively small number of bits, e.g., 8, can be dynamically processed. Specifically, the tuning system operates in coarse, medium and fine tuning steps. During each step a predetermined group of bits derived from the station-representative digital word are selected for comparison and the duration of the measurement interval is set in accordance with the bits selected.

5 Claims, 1 Drawing Figure

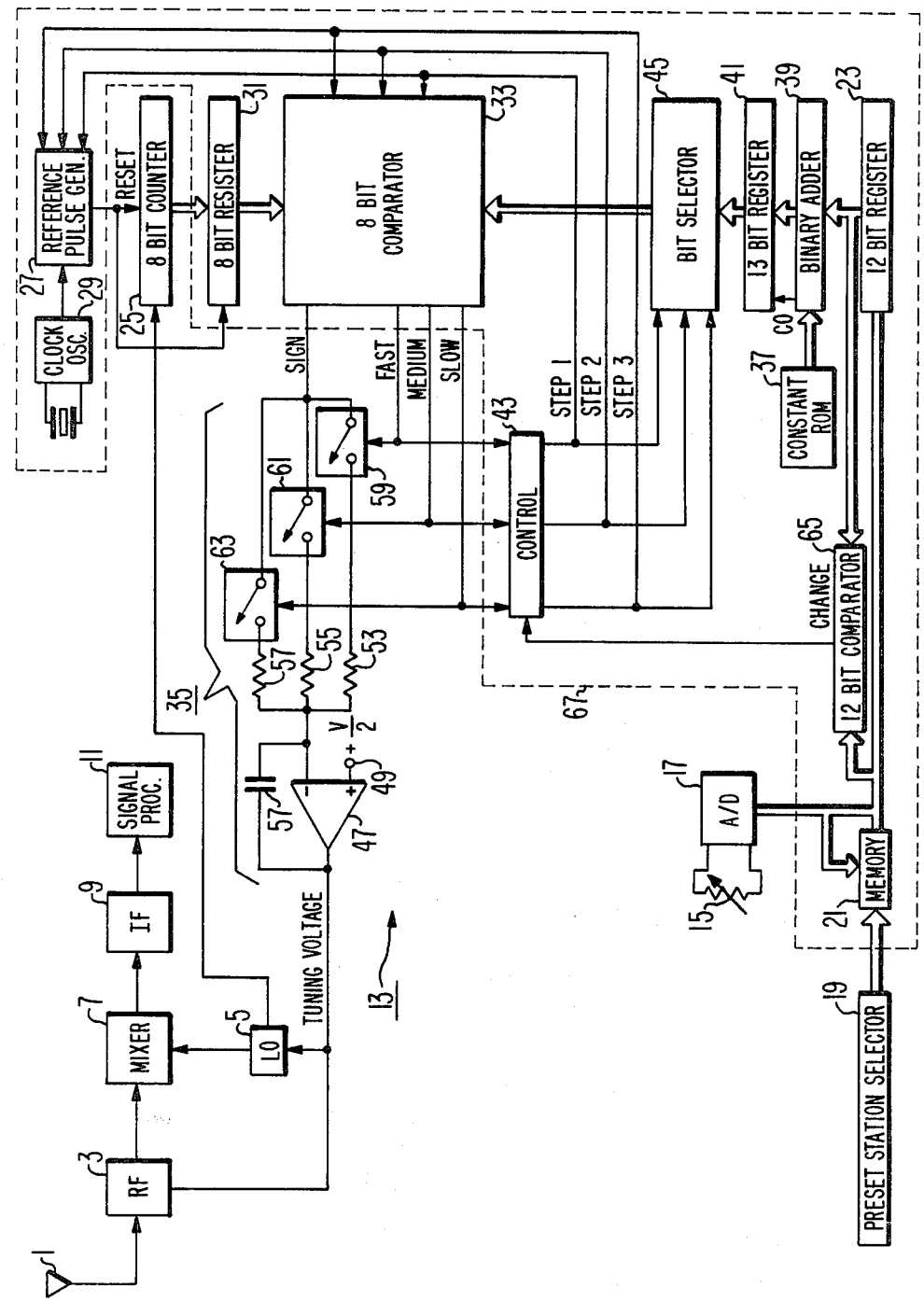

COMPARISON ARRANGEMENT FOR A DIGITAL TUNING SYSTEM

The present invention pertains to the field of digitally controlled tuning systems.

There are many known types of digitally controlled tuning systems comprising a relatively larger number of digital processing circuits each of which performs a respective individual function. Often, such tuning systems have been constructed using a relatively large number of already commercially available integrated circuits or a small number of custom designed large scale integrated circuits. The costs of such tuning systems tend to be high. Since microcomputers including a central processing unit (CPU) operating under the control of a stored program perform a large variety of digital functions and are extremely versatile relative to the amount of structure they include, it is desired to use them in digital tuning systems. Prior digital tuning systems have not been well suited for incorporating a microcomputer in a particularly inexpensive arrangement.

For example, a phase lock loop tuning system includes a digital phase comparator for comparing the phase of a variable frequency signal derived by dividing the frequency of the local oscillator signal by a programmable factor to a relatively stable reference frequency signal to produce error pulses which represent the frequency and phase deviation between the compared signals. The programmable factor is selected in accordance with the desired channel so that the frequency of the variable frequency signal is nominally the same as the reference frequency. The error pulses are filtered to generate a control signal for reducing the frequency error of the local oscillator. The digital phase comparator, which is a large and expensive portion of such a phase locked loop tuning system, unfortunately cannot be readily incorporated within a microcomputer.

In addition, since the resolution, response and filtering requirements of a phase locked loop are all related to the reference frequency, certain compromises must be made in a phase locked loop tuning system. That is, the resolution, e.g., smallness of the frequency step size is improved when the reference frequency is decreased while the response time and ease of filtering reference components from the control signal for the local oscillator are improved when the reference frequency is increased. Therefore, to accord these factors, the selection of the reference frequency and design of the filter are somewhat critical.

Another type of known frequency control system includes a counter for counting cycles of the local oscillator signal and a digital comparator for determining the error between the accumulated count and a predetermined count for the selected channel during a relatively stable measurement interval. If the accumulated count is low or high, the digital comparator generates logic levels for increasing or decreasing, respectively, the frequency of the local oscillator signal.

It has been found that in such systems the compromises between resolution response time and filtering requirements tend not to be as severe as in phase locked loop tuning systems. However, the frequency resolution depends directly on the number of stages in the counter and the digital comparator. This makes it difficult to use an inexpensive microcomputer because microcomputers capable of dynamically processing data comprising a large number, e.g., 12, of binary signals or bits (binary digits) are still too expensive for practical use in commercial receivers. To that end, the present improvement allows a counter and digital comparator having a smaller number of stages than would be conventionally used in such a system to provide a given resolution to be employed. Accordingly, it is particularly useful for use with relatively inexpensive microcomputers.

In accordance with the present invention, in a tuning system of the type described above having station or channel selector means for generating a station-representative digital word, counter means for counting periods of a local oscillator signal during a measurement interval to generate a count-representative digital word, timing means for establishing the duration of the measurement interval, and comparison means for generating a control signal for controlling the frequency of the local oscillator signal in accordance with the deviation between the station-representative digital word and count-representative word, apparatus is provided whereby the counter means and comparison means need only process N bits while M bits, M being greater than N, are generated by the station or channel selector means. Specifically, the latter apparatus includes bit selection means for successively applying different groups of N bits derived, at least partially, from the station-representative digital word, each group comprising lower order bits than the previous one, to the comparator means and interval selection means for setting the duration of the measurement interval in accordance with the group of N bits applied to the comparison means during respective operating steps.

The present invention will be described, by way of example, with reference to a tuning control system of an AM radio receiver for tuning RF carriers in the medium wave (MW) range between 520 and 1672 kHz as used in Europe. It will be appreciated that the basic arrangement is applicable to other frequency ranges and may be employed in television as well as radio receivers.

Referring now to the sole FIGURE of the accompanying drawing, a radio receiver includes an antenna 1, RF (radio frequency) section 3, LO (local oscillator) 5, mixer 7, IF (intermediate frequency) section 9 and signal processing section 11 arranged in conventional fashion. The tuning of RF section 3 and LO 5 is controlled in response to the magnitude of a tuning voltage generated by the present tuning control system generally indicated as 13 in accordance with the station selected by a user.

A station may be selected by the adjustment of the setting of a potentiometer 15. An analog to digital (A/D) converter 17 converts the setting of potentiometer 15 into a pulse duration which in turn is converted into a corresponding digital word. This type of A/D conversion is well known and may, e.g., include an arrangement such as disclosed in U.S. patent application, Ser. No. 10,868, entitled "Self-Stabilizing Analog to Digital Converter Useful in Phase Locked Loop Tuning Systems", filed in the name of the same inventor on Feb. 9, 1979 and issued on Oct. 7, 1980 as U.S. Pat. No. 4,227,186, which is hereby incorporated by reference. A station may also be selected by operating a corresponding one of preset station switches 19. This causes a respective memory location of a memory 21 containing the corresponding digital word previously entered from A/D converter 17 to be addressed and read. The digital word derived from either A/D converter 17 or memory 21 is coupled to a storage register 23.

Basically, tuning control system 13 operates by comparing the station related number represented by the digital word stored in register 23 to the count related number represented by the digital word generated by a counter 25 by counting cycles of the LO signal during a relatively stable measurement interval. The measurement interval corresponds to the time between RESET pulses generated by a reference pulse generator 27 in response to the output signal of a crystal oscillator 29. At the end of the measurement interval, in response to the RESET pulses, the accumulated count is stored in an 8 bit register 31. Depending on the relationship between the station related number and the accumulated count, a digital comparator 33 generates control levels which are applied to an integrator 35. In response, integrator 35 controls the magnitude of the tuning voltage to either increase, decrease or maintain the frequency of the LO signal.

To provide a resolution of 4096 levels or 4095 steps, A/D converter 17, memory 21 and register 23 have 12 stages for supplying 12 bits (binary digits). In the MW range, this ensures a frequency step size of:

$$\frac{(1672-520)\text{kHz}}{4095} = 281.25\text{Hz} = \pm 140.625\text{Hz} \tag{1}$$

Since the lowest setting of potentiometer 15 corresponds to the decimal number 0 or the digital word 000000000000 while the lowest LO frequency is $$520 \text{ khz} + 455 \text{ kHz} = 975 \text{ kHz}, \tag{2}$$

where 455 kHz is the nominal frequency of IF section 9, a digital word representing 975 kHz stored in a ROM (read only memory) 37 is added by a digital adder 39 to the digital word stored in register 23. The 13 bit result, including a carry out (CO) bit, is stored in a 13 bit storage register 41.

To permit the use of a relatively inexpensive microcomputer having digital circuitry capable of processing only 8 bits directly, counter 25 and comparator 33 each only have 8 stages. However, to allow a full 12 bit comparison to be made and thereby provide 12 bit resolution, tuning control system 13 operates in three operating steps. In each step, a respective predetermined group of 8 bits derived from the 13 bit number produced by adder 39 and stored in register 41 is compared with the 8 bits accumulated by counter 25 and stored in register 31 during a respective predetermined measurement interval. In each step the measurement interval is set in accordance with the order of the 8 bits derived from register 41. During the first step, eight high order bits derived from register 41 are compared with the 8 bits accumulated in counter 25 during a relatively short duration measurement interval to produce a course frequency adjustment of the LO signal. During the second step, 8 medium order bits derived from register 41 are compared with the 8 bits accumulated in counter 25 during a medium duration measurement interval to produce a medium frequency adjustment of the LO signal. During the third step, 8 low order bits derived from register 41 are compared with the 8 bits accumulated in counter 25 during a relatively long measurement duration interval to produce a fine frequency adjustment of the LO signal. In addition, integrator 35 is controlled to provide successively slower response times during successive steps.

A control unit 43 generates STEP 1, STEP 2 and STEP 3 control signals which indicate the step in which control unit 13 is operating. A bit selector 45 selects the portion of the 12 bit digital word stored in register 41 to be compared with the 8 bit count stored in register 31 in response to the control signals generated by control unit 43. In addition, reference pulse generator 27 sets the time interval between RESET pulses in response to the control signals generated by control unit 43.

Integrator 35 includes: an operational amplifier 47 having noninverting (+) and inverting (−) inputs and an output; a terminal 49 for applying a voltage +V/2 to the noninverting input; a feedback capacitor 51 connected between the inverting input and output of operational amplifier 47; and three resistors 53, 55 and 57 through which a SIGN output signal of comparator 33 is selectively applied to the inverting input of operational amplifier 45 when a respective one of switches 59, 61 and 63 is closed. Resistors 53, 55 and 57 have successively higher values. Although switches 59, 61 and 63 are shown schematically as being electro-mechanical, they are desirably semiconductor switches. Switches 59, 61 and 63 are selectively closed in response to respective FAST, MEDIUM and SLOW speed control signals generated by comparator 33 to control the response time of integrator 35 during respective first, second and third step operations. During each step, comparator 33 is enabled to generate the respective one of the FAST, MEDIUM and SLOW signals in response to the respective one of the STEP 1, STEP 2 and STEP 3 control signals.

During each step, comparator 33 causes the respective one of the FAST, MEDIUM and SLOW response time speed control signals to have the high logic level if the difference between the absolute value of the accumulated count number stored in register 31, hereinafter referred to as X, and the absolute value of the number provided by bit selector 45, hereinafter referred to as Y, is greater than or equal to a predetermined tolerance, e.g., 8, and the low logic level if the difference is less than the predetermined tolerance. This can be mathematically expressed as follows:

if $|X|-|Y| \geq 8$, the speed control signal is "high" (3)

if $|X|-|Y| < 8$, the speed control signal is "low" (4)

When a speed control signal is "high", the respective one of switches 59, 61 and 63 is closed thereby coupling the SIGN signal to the inverting input of amplifier 47. When a speed control signal is "low", the corresponding one of switches 59, 61 and 63 is opened thereby decoupling the SIGN signal to the inverting input of amplifier 47. Thus, when one of switches 59, 61 and 63 is closed, the tuning voltage is changed in a direction corresponding to the level of the SIGN signal and at a speed determined by the respective one of resistors 53, 55 and 57 and when none of switches 59, 61 and 63 is closed, the tuning voltage remains substantially unchanged. Comparator 35 causes the SIGN signal to have the high logic level when X−Y is positive and the low logic level when X−Y is negative. The high level is chosen as V volts and the low level is chosen as 0 volts. As a result, when the SIGN signal is "high", the tuning voltage, and therefore the LO frequency, is conditioned to decrease and when the SIGN signal is "low" the tuning voltage, and therefore the LO frequency, is conditioned to increase.

A 12 bit compartor 65 compares the input station selection data and the contents of 12 bit register 23 and generates a CHANGE signal if they are not the same. Thus, the CHANGE signal indicates that a new station has been selected. Control unit 43 generates a STEP 1 control signal to initiate STEP 1 operation in response to the CHANGE signal.

While tuning control system 13 has been described with reference to discrete logic elements, as noted above, a large portion of the sytem is well suited for incorporation within a microcomputer as indicated by dotted line 67. A microcomputer of the "MCS-48" type, such as the 8048, 8049, 8021 and 8022, commercially available from Intel Corporation of California, is suitable for such purpose. These microcomputers and their operations are described in detail in the "MCS-48 Family of Single Chip Microcomputers-User's Manual" published by Intel Corporation in 1979, which is hereby incorporated by reference. In such an arrangement control unit 43 may comprise a CPU (central processing unit) operating in response to a program stored in a ROM; the various storage registers may comprise memory locations of a RAM (random access memory); and the functions of comparator 33, adder 39, bit selector 45 and comparator 65 may be performed by the CPU. In addition, oscillator 29 and reference pulse generator 27 may comprise the clock oscillator and a programmable timer or counter of the microcomputer. Signals are coupled to and from portions of tuning system 13 external to microcomputer 67 through input and output ports within microcomputer 67 (not specifically shown). It is further contemplated that A/D converter 17 may be controlled by the CPU of microcomputer 67 and that preset memory 21 may comprise a portion of the RAM of microcomputer 67.

It is noted that while a microcomputer of the Intel "MCS-48" type is an 8 bit microcomputer, i.e., one in which the CPU, registers and memory locations process data consisting of only 8 bits, many portions of tuning system 13 are required process data consisting of 12 or more bits. This is of no particular concern with respect to static data since the 12 or more bits can be partitioned, e.g., into a group (or byte) of 8 high order bits and a group of 4 or more low order bits, and stored in two respective 8 bit registers or memory locations. In this case, when a data word consisting of 12 or more bits is transferred from one register or location to another, e.g., from A/D converter or memory 21 to register 23, its high and low order bytes are transferred in successive operations.

Counter 25 is shown as being located external to microcomputer 67 since its contents are changed at the relatively high frequency of the LO signal. However, it will be appreciated that a timer or event counter within the microcomputer such as a 8021 commercially available from Intel Corporation may be used for such purpose.

In the following description of the operation of tuning system 13 which, as noted above, is arranged, by way of example, for tuning carriers in the MW range between 520 and 1672 kHz reference to the following correlation between the 13 bits stored in register 41 and the frequency step sizes which they represent will be helpful.

| BIT | Frequency Step Size (in kHz) |
|---|---|
| $2^0$ | 0.28125 |
| $2^1$ | 0.5625 |
| $2^2$ | 1.125 |

| BIT | Frequency Step Size (in kHz) |
|---|---|
| $2^3$ | 2.25 |
| $2^4$ | 4.5 |
| $2^5$ | 9.0 |
| $2^6$ | 18.0 |
| $2^7$ | 36.0 |
| $2^8$ | 72.0 |
| $2^9$ | 144.0 |
| $2^{10}$ | 288.0 |
| $2^{11}$ | 576.0 |
| CO = $2^{12}$ | 1152.0 |

When a new station is selected, a CHANGE signal is generated by comparator 65. In response, control unit 43 generates a STEP 1 control signal thereby initiating the step 1 operation. Since the highest desired LO frequency in the MW range is 2127 kHz while highest order bit available from register 41, i.e., the CO bit, only corresponds to 1152.0 kHz, in response to the STEP 1 control signal, bit selector 45 provides 8 bits consisting of one bit corresponding to $2^{13}$ or 2304 kHz as the most significant bit (MSB) and the CO bit and bits $2^{11}$ through $2^6$ from register 41 to comparator 33 as the remainder. In these 8 bits, the least significant bit (LSB) is the $2^6$ bit from register 41. Since the MSB corresponds to a LO frequency higher than the highest desired LO frequency, the MSB is set to a low logic level. Since the MSB value of the 8 bit comparison corresponds to 2304 kHz which would be $2^7$ or 128 periods of the LO signal, in response to the STEP 1 control signal, reference pulse generator 27 sets the duration of the measurement interval to 128/2304 kHz or 55.5 microseconds. Integrator 35 is controlled in response to the SIGN and FAST signals generated by comparator 33 until the deviation between the count X accumulated in counter 25 during the measurement interval and the station related number Y provided by bit selector 45 is less than 8. Since the tolerance is 8 and the LSB corresponds to 18 kHz, during the first step, the LO frequency is controlled to be less than $\pm 8 \times$ LSB value or within $\pm 7 \times 18$ kHz which equals $\pm 126$ kHz.

In step 1 when the LO frequency is within tolerance, the FAST signal becomes the low logic level. However, before step 2 is initiated, the input station selection data is compared to the contents of register 23 by comparator 65. If the CHANGE signal is generated, step 1 operation continues with the new station selection data as the basis for the comparison. If the CHANGE signal is not generated, control unit 43 generates a STEP 2 control signal thereby initiating step 2 operation.

During step 2, in response to the STEP 2 control signal, bit selector 45 provides 8 bits in which the MSB is the $2^8$ bit corresponding to 72 kHz from register 41 and the LSB is the $2^1$ bit corresponding to 0.5625 kHz from register 41 to comparator 33. Since the MSB value corresponds to 72 kHz which would be $2^7$ or 128 periods of the LO signal, in response to the STEP 2 control signal, reference pulse generator 27 sets the duration of the measurement interval to 128/72 kHz or 1.77 milliseconds. Integrator 35 is controlled in response to the SIGN and MEDIUM signals until the deviation between X and Y is less than 8. Since the tolerance is 8 and the LSB corresponds to 0.5625 kHz, during the second step, the LO frequency is controlled to be less than $8 \times$ LSB value or within $\pm 7 \times 0.5625$ kHz which equals $\pm 3.9375$ kHz.

In step 2, when the LO frequency is within tolerance, the MEDIUM signal becomes the low logic level. However, before step 3 operation is initiated, the input station selection data is again compared with the contents of register 23 by comparator 65. If a CHANGE signal is generated, the STEP 1 control signal is generated to reinitiate step 1 operation. If no CHANGE signal is generated, the STEP 3 control signal is generated to initiate step 3 operation.

During step 3, in response to the STEP 3 control signal, bit selector 45 provides 8 bits in which the MSB is the $2^4$ bit from register 41 and the remaining bits are the bits $2^3$ through $2^0$ from register 41 and three bits set to the low logic levels corresponding to $2^{-1}$, $2^{-2}$ and $2^{-3}$, respectively. In these 8 bits, the $2^{-3}$ bit corresponds to 0.28125 kHz/$2^3$. Since MSB value of the 8 bit comparison corresponds to 4.5 kHz which would be $2^7$ or 128 periods of the LO signal, in response to the STEP 3 control signal, reference pulse generator 27 sets the duration of the measurement interval to 128/4.5 kHz or 28.44 milliseconds. Integrator 35 is controlled in response to the SIGN and SLOW signals until the deviation between X and Y is less than 8. Since the LSB corresponds to 0.28125 kHz/$2^3$ and the tolerance is 8, the LO frequency is kept within a tolerance of $\pm 8 \times$ LSB value or $\pm 7 \times 0.28125$ kHz/$2^3$ which equals $\pm 0.246$ kHz.

In step 3, when the LO frequency is within tolerance, the SLOW signal becomes a low logic level. In response, the STEP 1 control signal is generated thereby again initiating step 1 operation. Assuming that the LO frequency has not drifted out of tolerance, the FAST signal will be at the low logic level at the end of the respective measurement interval. In response, the STEP 2 control signal is generated thereby again initiating step 2 operation. Still assuming that the LO frequency has not drifted out of tolerance, the SLOW signal will be at the low logic level at the end of the respective measurement interval. In response, the STEP 3 control signal is generated thereby again initiating step 3 operation. Thus, step 1, step 2 and step 3 operations cyclically repeat. Assuming that the frequency of the LO frequency is relatively stable, once established for a selected station, switches 59, 61 and 63 remain open. Therefore, under these conditions, the tuning voltage is not intentionally changed. This is desirable since it avoids frequency modulation of the LO signal.

When a CA 3140 integrated circuit commercially available from RCA is employed as operational amplifier 47, the following component values for integrator 35 have been found suitable for keeping the LO frequency sufficiently stable.

| Component | Value |
| --- | --- |
| capacitor 57 | 0.22 microfarads |
| resistor 59 | 3900 ohms |
| resistor 61 | 56,000 ohms |
| resistor 63 | 820,000 ohms |

While the present invention as been described with reference to an AM radio receiver for RF carriers in the medium wave range, it will be appreciated that modifications may be made to accommodate it to other ranges. For example, for use in a television receiver a frequency divider, often referred to as a prescaler, may be interposed between LO 5 and counter 25 since the LO frequencies in television receivers are relatively high compared with those for an AM radio. To this end a different number of steps with corresponding bit selections and measurement intervals may be used. In addition, it is also contemplated that a 4 bit microprocessor or microcomputer may be used. These and other modifications are intended to be within the scope of the present invention as defined by the following claims.

What is claimed is:

1. In a tuning system for a receiver, apparatus comprising:
   station selection means for generating a station-representative digital word having M bits;
   local oscillator means for generating a local oscillator signal having a frequency controlled in response to a tuning signal;
   timing means for generating a measurement pulse;
   counter means for couting periods of said local oscillator signal during the duration of said measurement pulse to produce a count-representative digital word having N bits, where N is less than M;
   comparison means for generating at least one comparison signal representing the deviation between said station-representative digital word and said count-representative digital word;
   tuning signal generating means for generating said tuning signal in response to said comparison signal;
   control means for generating a plurality of step-representative control signals representing respective successive operating steps;
   bit selection means for selectively applying groups of successively lower order bits, N in number, including at least some of the bits of said station-representative digital word, to said comparison means in response to respective successive step-representative control signals; and
   measurement interval control means for selectively setting the duration of said measurement pulse to successively higher values corresponding to the order of respective groups of said N bits applied to said comparison means in response to respective successive step-representative control signals;
   said control means generating the step-representative signal representing the next successive operating step when said comparison signal represents a deviation less than a predetermined deviation.

2. The apparatus recited in claim 1 wherein:
   said tuning signal generating means includes rate control means for selectively setting the rate of change of said tuning signal to successively smaller values in response to respective successive step-representative control signals.

3. The apparatus recited in claim 2 wherein:
   said tuning signal generating means includes an amplifier having input and output terminals, said tuning signal being generated at said output terminal; capacitance means connected between said input and output terminals; resistance means connected between said input terminal and said comparison means; and switch means coupled to one of said capacitance and resistance means for selectively setting it to successively larger impedance values in response to successive step-representative control signals.

4. The apparatus recited in claim 3 wherein:
   said resistive element includes a plurality of resistors;
   said switch means includes a plurality of switches;

said comparison means generates a sign signal representing the sense of the deviation and when enabled by one of said step-representative control signal generates a respective magnitude signal representing the magnitude of the deviation, said sense signal having a first level when the deviation is positive and a second level when the deviation is negative, each of said magnitude signals having a predetermined level when the deviation is less than the predetermined deviation, respective ones of said resistors and switches being connected in series between said input terminal and said comparator for selectively applying said sign signal to said inut terminal, each one of said switches being responsive to a respective one of said magnitude signals for applying said sign signal to said input terminal when said respective magnitude signal has the predetermined level.

5. The apparatus recited in claim 1 wherein:
at least said station selection means, said timing means, said comparison means, said control means, said bit selection means, and said measurement interval control means are incorporated within a microcomputer.

* * * * *